(12) United States Patent
Wang et al.

(10) Patent No.: US 8,385,991 B2
(45) Date of Patent: Feb. 26, 2013

(54) DUAL-AXIS HINGE STRUCTURE AND ELECTRIC DEVICE HAVING THE SAME

(75) Inventors: Chun-Wen Wang, Tainan (TW); Shan-Feng Chang, Luzhu Township, Taoyuan County (TW)

(73) Assignee: Quanta Computer Inc., Taoyuan Shien (TW)

( * ) Notice: Subject to any disclaimer, the term of this patent is extended or adjusted under 35 U.S.C. 154(b) by 0 days.

(21) Appl. No.: 13/303,184

(22) Filed: Nov. 23, 2011

(65) Prior Publication Data

US 2013/0016492 A1 Jan. 17, 2013

(30) Foreign Application Priority Data

Jul. 13, 2011 (TW) .............................. 100212855 A

(51) Int. Cl.
*H04M 1/00* (2006.01)
*E05D 3/10* (2006.01)
(52) U.S. Cl. ................. 455/575.3; 455/575.1; 455/90.3; 16/221; 16/367
(58) Field of Classification Search ........................ None
See application file for complete search history.

(56) References Cited

U.S. PATENT DOCUMENTS

| | | | |
|---|---|---|---|
| 2006/0037175 A1* | 2/2006 | Hyun | 16/221 |
| 2006/0197861 A1* | 9/2006 | Won et al. | 348/333.06 |
| 2007/0050946 A1* | 3/2007 | Shih et al. | 16/367 |
| 2007/0123319 A1* | 5/2007 | Hwang | 455/575.1 |
| 2010/0011539 A1* | 1/2010 | Huang et al. | 16/367 |
| 2010/0180403 A1* | 7/2010 | Wei et al. | 16/371 |

* cited by examiner

*Primary Examiner* — Erika A Washington
(74) *Attorney, Agent, or Firm* — Rabin & Berdo, P.C.

(57) ABSTRACT

A dual-axis hinge structure and electric device having the same are provided, and the dual-axis hinge structure includes a hinge base having a pushed portion, a first pivot portion having a first cam and a first shaft, a second pivot portion having a second cam and a second shaft, and a restoring member connected both the first pivot portion and the second pivot portion. The first shaft is pivoted on the hinge base, and the first cam is fixed on the first shaft, and the first cam is contacted with one lateral side of the pushed portion. The second shaft is parallel to the first shaft, and is pivoted on the hinge base, and the second cam is fixed on the second shaft, and the second cam is contacted with another lateral side of the pushed portion.

11 Claims, 9 Drawing Sheets

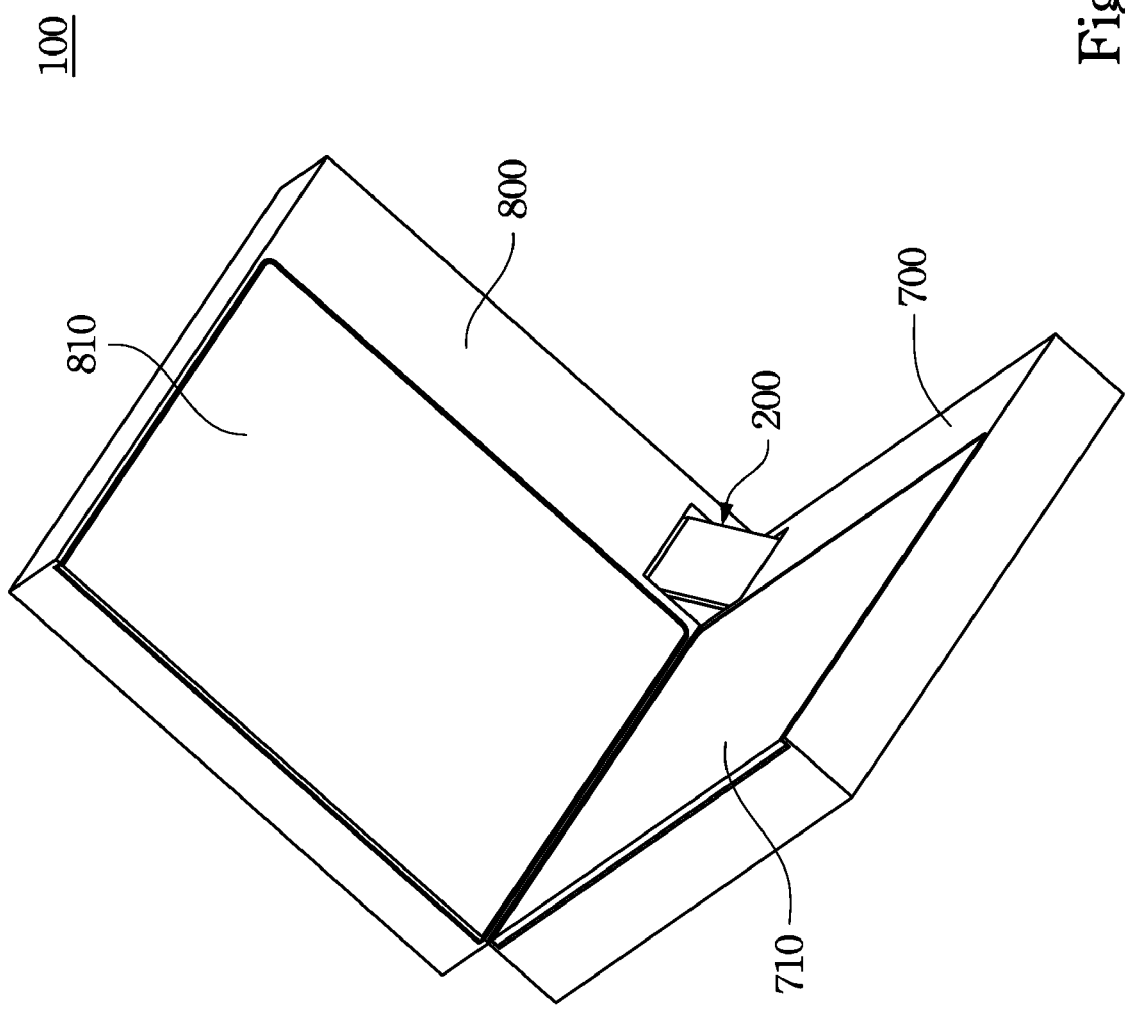

DUAL-AXIS HINGE STRUCTURE AND ELECTRIC DEVICE HAVING THE SAME

RELATED APPLICATIONS

This application claims priority to Taiwanese Application Serial Number 100211855, filed Jul. 13, 2011, which is herein incorporated by reference.

BACKGROUND

1. Technical Field

The present invention relates to a hinge structure, more particular to a biaxial hinge structure.

2. Description of Related Art

At present, an electric device such as a notebook computer, a video game device, an electronic-book device or a mobile phone, is commonly provided with a hinge structure for pivotally connecting a first member and a second member of the electric device, so that the first member and the second member can be pivoted to flip with each other.

However, in order to guarantee that the first member and the second member can be pivoted to flip with each other, when the first member is pivoted to flip on the second member thereof, a first gap between the first member and the second member thereof must be kept so that the first member and second member thereof will be not collided with each other. Since the first gap between the first member and the second member thereof must be kept, thus, the electric device is usually restricted in product appearance.

However, because the first gap is kept between the first member and the second member thereof, while the first member is pivoted to flip on the second member thereof, thus, after the hinge structure is finished to pivot, a second gap between the first member and the second member which are parallel with each other is generated and equals to the first gap.

In view of that, the conventional hinge structure is expected to be improved and innovated for those drawbacks mentioned above.

SUMMARY

The present invention is to provide a dual-axis hinge structure and an electric device having the same, which is capable of dynamically varying a gap between a first member and a second member when the dual-axis hinge structure is operated to rotate both the first member and the second member.

Therefore, when the dual-axis hinge structure is operated to rotate both the first member and the second member, the first member and the second member will not collide with each other. Also, a first gap formed between the first member and the second member positioned abreast is smaller than a second gap formed between the first member and the second member which are being rotated mutually.

The dual-axis hinge structure provided in one practice of the present invention comprises a hinge base, a first pivot portion, a second pivot portion and a restoring member. The hinge base comprises at least one pushed portion having two opposite contacting surfaces thereof. The first pivot portion comprises a first rotary shaft and at least one first cam. The first rotary shaft is pivotally disposed on one end of the hinge base, and the first cam is non-rotatably disposed on the first rotary shaft, and constantly contacts to one of the opposite contacting surfaces of the pushed portion, and the first cam has a first summit thereon. The second pivot portion comprises a second rotary shaft and at least a second cam. The second rotary shaft is pivotally disposed on the other end of the hinge base, and is parallel to the first rotary shaft. The second cam is non-rotatably disposed on the second rotary shaft, and constantly contacts to the other of the opposite contacting surfaces of the pushed portion, and the second cam has a second summit thereon. The restoring member is interposed between the first rotary shaft and the second rotary shaft, and couples to the first rotary shaft and the second rotary shaft with two opposite ends thereof. When both the first cam and the second cam rotate such that the first summit and the second summit contact the opposite contacting surfaces of the pushed portion, respectively, the first rotary shaft and the second rotary shaft are reversely moved away from the pushed portion.

Also, the electric device provided in the present invention comprises the aforementioned dual-axis hinge structure, a first member and a second member. The first member is fixedly disposed on the first rotary shaft, and simultaneously rotates with the first rotary shaft. The second member is fixedly disposed on the second rotary shaft and simultaneously rotates with the second rotary shaft. When the first member and the second member are positioned abreast, a first gap is formed between the first member and the second member. When the first summit and the second summit respectively contact the opposite contacting surfaces of the pushed portion, a second gap is formed between the first member and the second member. The second gap is greater than the first gap.

Therefore, since a gap between the first rotary shaft and the second rotary shaft can be enlarged when the dual-axis hinge structure is operated to rotate both the first member and the second member, a gap between the first member and the second member can be enlarged as well. Thus, when the first member and the second member are positioned abreast, two screens respectively provided on the first member and the second member can be combined into a nearly seamless screen so as to increase purchase intentions of consumers.

BRIEF DESCRIPTION OF THE DRAWINGS

The present invention will be apparent to those skilled in the art by reading the following detailed description of a preferred embodiment thereof, with reference to the attached drawings, in which:

FIG. 6B is a perspective schematic view of an electric device having the dual-axis hinge structure in a process between a folded mode and an unfolded mode according to the embodiment of the present invention.

DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
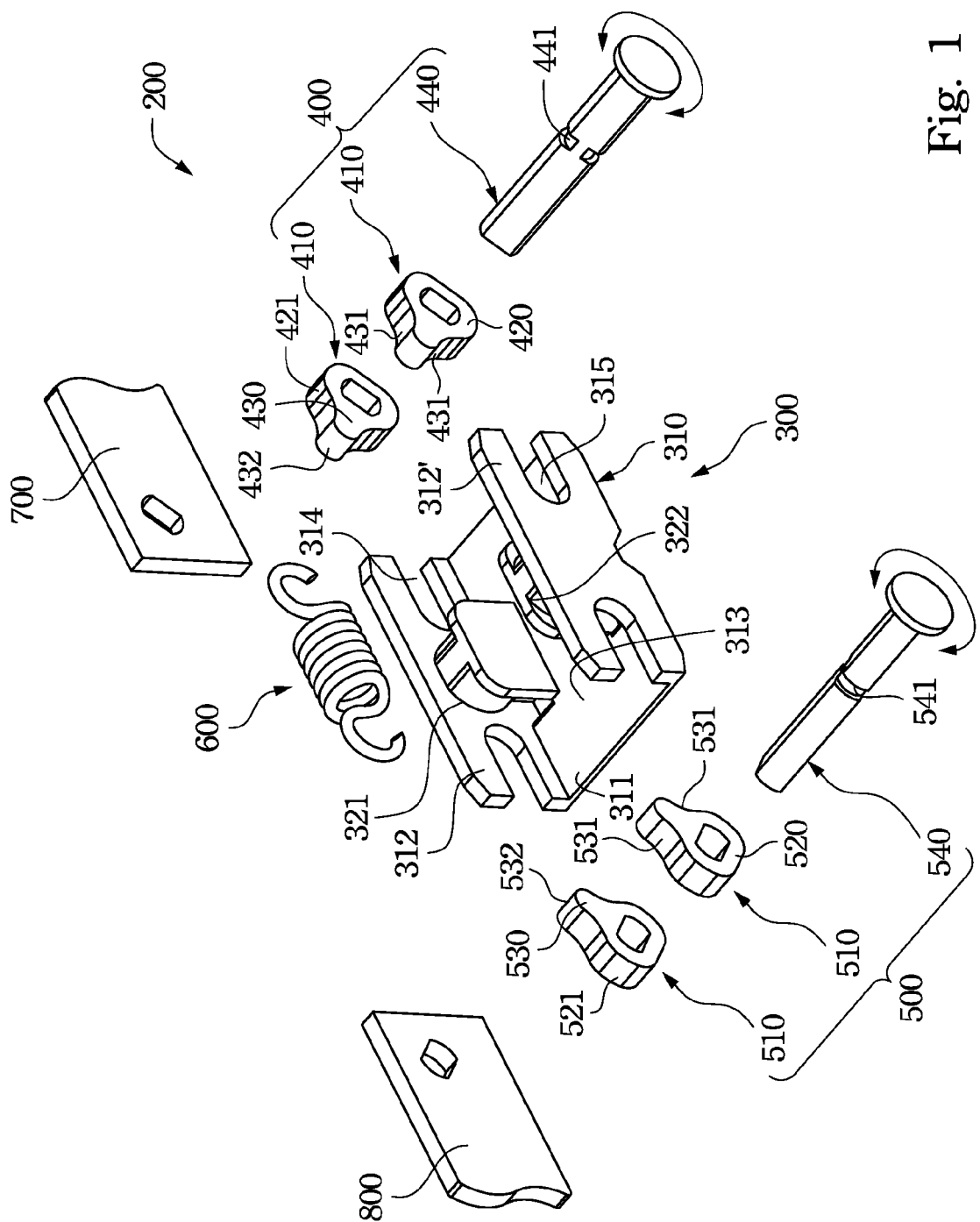
FIG. 1 is an exploded view of a dual-axis hinge structure according to an embodiment of the present invention.
Figure 2:
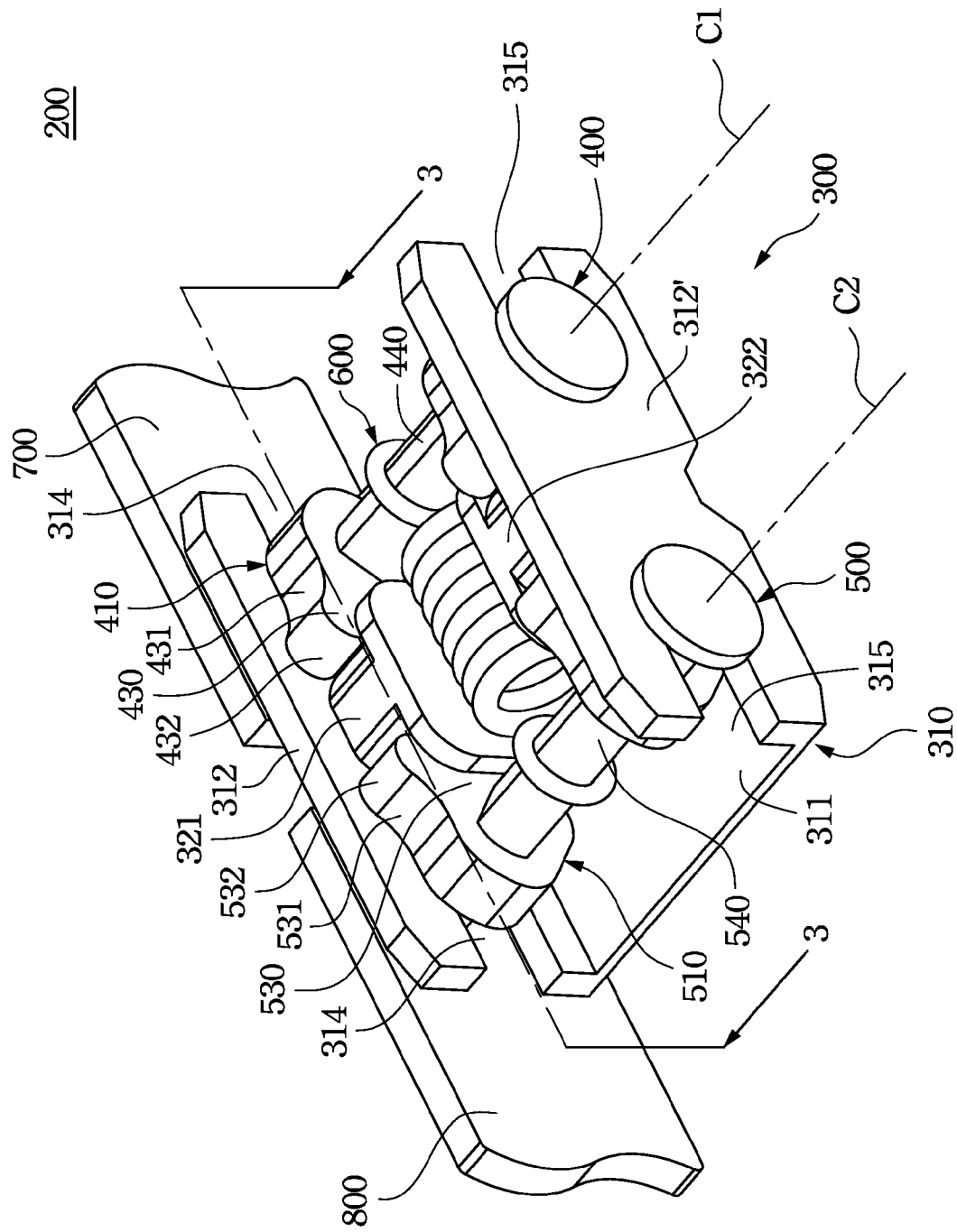
FIG. 2 is an assembling view of the dual-axis hinge structure in FIG. 1.

Refer to FIG. 1 and FIG. 2, FIG. 1 is an exploded view of a dual-axis hinge structure 200 according to an embodiment of the present invention, and FIG. 2 is an assembling view of the dual-axis hinge structure 200 in FIG. 1.

The embodiment of the present invention is to provide a dual-axis hinge structure 200. The dual-axis hinge structure 200 includes a hinge base 300, a first pivot portion 400, a second pivot portion 500 and a restoring member (e.g. elastic element 600).

The first pivot portion 400 can be coupled to a first member 700 (e.g. a rack or a case) so that the first member 700 can be rotated with the first pivot portion 400 simultaneously. The second pivot portion 500 can be coupled to a second member 800 (e.g. a rack or a case) so that the second member 800 can be rotated with the second pivot portion 500 simultaneously. The first pivot portion 400 and the second pivot portion 500 are symmetrically and pivotally disposed on two opposite ends of the hinge base 300, respectively. The restoring member (e.g. elastic element 600) is interposed between the first pivot portion 400 and the second pivot portion 500, and couples to the first pivot portion 400 and the second pivot portion 500 with two opposite ends thereof.

Specifically, the hinge base 300 includes a bracket 310, a first pushed portion 321 and a second pushed portion 322. The bracket 310 is presented as a "U" shape, and comprises a bottom plane 311 and two opposite sidewalls (i.e. first sidewall 312 and second sidewall 312') both extending towards a same direction in parallel from two opposite sides of the bottom plane 311. The bottom plane 311, the first sidewall 312 and the second sidewall 312' mutually surround a containing space 313 therein. The first pushed portion 321 and the second pushed portion 322 are symmetrically disposed on the two opposite sides of the bottom plane 311 inside the containing space 313.

For instance, the first pushed portion 321 is disposed on an inner surface of the first sidewall 312, and the second pushed portion 322 is disposed on an inner surface of the second sidewall 312', however, the present invention is not limited thereto.

Two opposite sides of the first sidewall 312, which the first pushed portion 321 is arranged therebetween, respectively have a first elongate slit 314 thereon, and two opposite sides of the second sidewall 312', which the second pushed portion 322 is arranged therebetween, respectively have a second elongate slit 315 thereon.

The first pivot portion 400 comprises two first cams 410 and a first rotary shaft 440. The first rotary shaft 440 is pivotally disposed on the bracket 310 in which one end of the first rotary shaft 440 penetrates through one of the first elongate slits 314, and is non-rotatably disposed on the first member 700 relatively, and the other end of the first rotary shaft 440 penetrates through one of the second elongate slits 315. Therefore, the first rotary shaft 440 is pivotally disposed on one end of the bracket 310.

The second pivot portion 500 comprises two second cams 510 and a second rotary shaft 540. The second rotary shaft 540 is pivotally disposed on the bracket 310 and is in parallel with the first rotary shaft 440, in which one end of the second rotary shaft 540 penetrates through the other of the second elongate slits 314, and is non-rotatably disposed on the second member 800 relatively, and the other end of the second rotary shaft 540 penetrates through the other of the second elongate slits 315. Therefore, the second rotary shaft 540 is pivotally disposed on the other end of the bracket 310.

The first cams 410 are spaced, and are non-rotatably disposed on the first rotary shaft 440 so that each of the first cams 410 can be simultaneously rotated with the first rotary shaft 440. Also, the first cams 410 respectively contact to the same contacting surfaces of the first pushed portion 321 and the second pushed portion 322.

The second cams 510 are spaced, and are non-rotatably disposed on the second rotary shaft 540 so that each of the second cams 510 can be simultaneously rotated with the second rotary shaft 540. Also, the second cams 510 respectively contact to the same contacting surfaces of the first pushed portion 321 and the second pushed portion 322.

Specifically, each of the first cams 410 includes a first wheel body 420 and a first convex potion 430 extending outwards a circumferential surface 421 of the first wheel body 420. The first wheel bodies 410 are non-rotatably penetrated through by the first rotary shaft 440, and each of the first convex potions 430 contact the same contacting surfaces of the first pushed portion 321 and the second pushed portion 322.

Each of the second cams 510 includes a second wheel body 520 and a second convex potion 530 extending outwards a circumferential surface 521 of the second wheel body 520. The second wheel bodies 510 are non-rotatably penetrated through by the second rotary shaft 540, and each of the second convex potions 530 contact the same contacting surfaces of the first pushed portion 321 and the second pushed portion 322.

The aforementioned first convex potion 430 have two lateral surfaces 431 and a first summit 432 in which the first summit 432 is an intersection of the lateral surfaces 431 of the first convex potion 430, and is a position of the first convex potion 430 farest away from the first wheel body 420. The aforementioned second convex potion 530 have two lateral surfaces 531 and a second summit 532 in which the second summit 532 is an intersection of the lateral surfaces 531 of the second convex potion 530, and is a position of the second convex potion 530 farest away from the second wheel body 520.

The restoring member (e.g. elastic element 600) can be a coil spring, and is interposed between the first pushed portion 321 and the second pushed portion 322, and between the first rotary shaft 440 and the second rotary shaft 540. Two opposite ends of the elastic element 600 respectively hooks to a joint portion 441 of the first rotary shaft 440 and a joint portion 541 of the second rotary shaft 540.

Figure 3A:
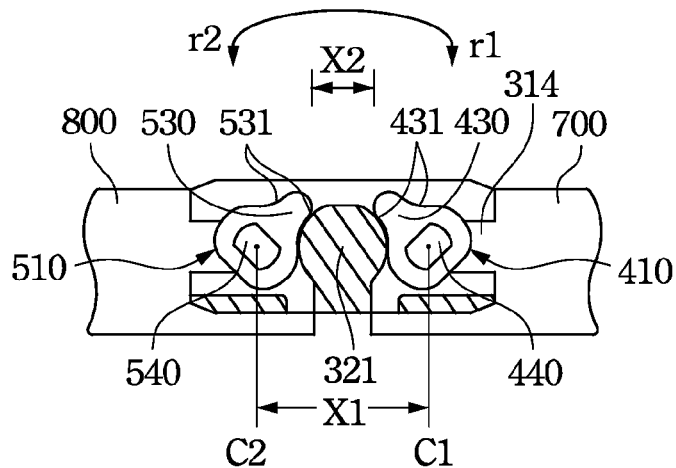
FIG. 3A to FIG. 3C are cross sectional views taken along line 3-3 of FIG. 2 according to continual actions of operating the dual-axis hinge structure.
Figure 3B:
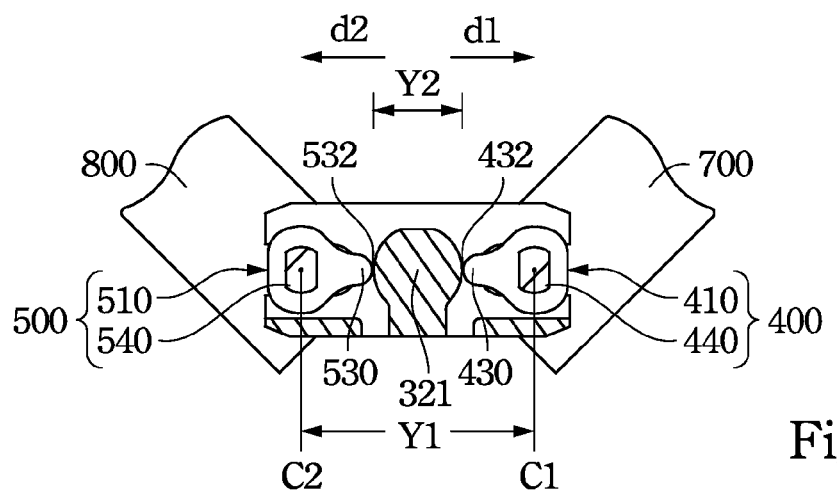
Figure 3C:
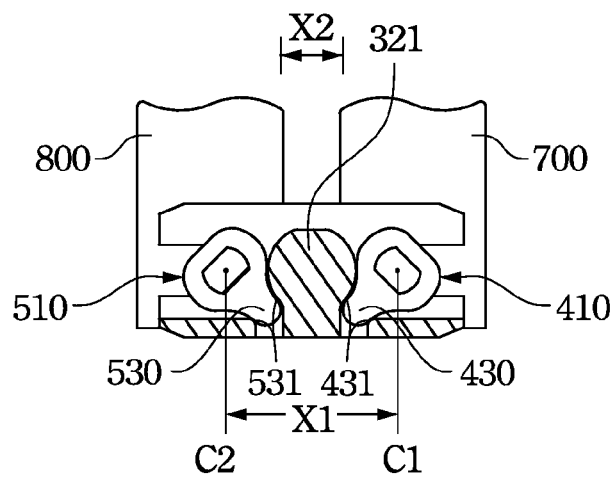

Refer to FIG. 3A to FIG. 3C, FIG. 3A to FIG. 3C are cross sectional views taken along line 3-3 of FIG. 2 according to continual actions of operating the dual-axis hinge structure 200.

Refer to FIG. 3A and FIG. 3C, when the first member 700 and the second member 800 have not been rotated yet, namely, the first member 700 and the second member 800 are positioned abreast, the first cam 410 and the second cam 510 respectively lean against the top of the two opposite contacting surfaces of the first pushed portion 321 (FIG. 3A) with one of the lateral surfaces 431 of the first convex potion 430 and one of the lateral surfaces 531 of the second convex potion 530; or the first cam 410 and the second cam 510 respectively lean against the bottom of the two opposite contacting surfaces of the first pushed portion 321 (FIG. 3C) with the other lateral surface 431 of the first convex potion 430 and the other lateral surface 531 of the second convex potion 530.

At the moment, a first gap X1 is formed between a pivot axis line (i.e. pivot point) C1 of the first rotary shaft 440 and a pivot axis line (i.e. pivot point) C2 of the second rotary shaft 540.

Refer to FIG. 3A, when a user operates the dual-axis hinge structure 200 to rotate both the first member 700 and the second member 800, the first cam 410 rotates co-directionally with the rotation of the first rotary shaft 440 according to a clock direction r2, so that the first convex potion 430 of the first cam 410 can slide on the corresponding surface of the first pushed portion 321; at same time, the second cam 510 rotates co-directionally with the rotation of the second rotary shaft 540 according to a clock direction r1, so that the second convex potion 530 of the second cam 510 can slide on the corresponding surface of the first pushed portion 321.

Refer to FIG. 3B, when the first summit 432 of the first convex potion 430 of the first cam 410 gradually contacts to the corresponding surface of the first pushed portion 321, the first pivot portion 400 is pushed by the first pushed portion 321 so that the first pivot portion 400 moves horizontally towards a direction d1 of being far away from the first pushed portion 321. At the same time, the first rotary shaft 440 is horizontally moved according to the direction d1 in the first elongate slit 314 and the second elongate slit (not shown), so as to carry the first member 700 to move horizontally according to the direction d1 as well.

When the second summit 532 of the second convex potion 530 of the second cam 510 gradually contacts to the corresponding surface of the first pushed portion 321, the second pivot portion 500 is pushed by the first pushed portion 321 so that the second pivot portion 500 moves horizontally towards a direction d2 of being far away from the first pushed portion 321. At the same time, the second rotary shaft 540 is horizontally moved according to the direction d1 in the first elongate slit 314 and the second elongate slit (not shown), so as to carry the second member 800 to move horizontally according to the direction d2 as well. Thus, a second gap Y1 is formed between a pivot axis line (i.e. pivot point) C1 of the first rotary shaft 440 and a pivot axis line (i.e. pivot point) C2 of the second rotary shaft 540, and the second gap Y1 is greater than the first gap X1.

Also, since both the first rotary shaft 440 and the second rotary shaft 540 are reversely moved away from the first pushed portion 321 according to the directions d1 and d2, the restoring member (e.g. elastic element 600) generates a restoring force due to deformation.

Since the gap between the pivot axis line (i.e. pivot point) C1 of the first rotary shaft 440 and the pivot axis line (i.e. pivot point) C2 of the second rotary shaft 540 can be varied dynamically as the first member 700 and the second member 800 are rotated, thus, a gap between the first member 700 and the second member 800 can be enlarged dynamically as the first member 700 and the second member 800 are rotated so that the first member and the second member will not collide with each other.

Refer to FIG. 3B, when the user continues to operate the dual-axis hinge structure 200 to rotate both the first member 700 and the second member 800, so that the first member 700 and the second member 800 are positioned abreast again, the first convex potion 430 and the second convex potion 530 do not contact the two opposite contacting surfaces of the first pushed portion 321 with the first summit 432 and the second summit 532 anymore, and the first convex potion 430 and the second convex potion 530 contact the two opposite contacting surfaces of the first pushed portion 321 with the other lateral surface 431 of the first convex potion 430 and the other lateral surface 531 of the second convex potion 530 instead.

The first cam 410 and the second cam 510 respectively lean against the bottom of the two opposite contacting surfaces of the first pushed portion 321 (FIG. 3C) with the other lateral surface 431 of the first convex potion 430 and the other lateral surface 531 of the second convex potion 530.

The restoring force of the restoring member (e.g. elastic element 600) pulls both the first rotary shaft 440 and the second rotary shaft 540 back to the first pushed portion 321 so that the first rotary shaft 440 and the second rotary shaft 540 reversely moves towards the first pushed portion 321 according to the directions d1 and d2, and the gap between the pivot axis line (i.e. pivot point) C1 and the pivot axis line (i.e. pivot point) C2 is restored to the first gap X1.

Therefore, when the first member 700 and the second member 800 are rotated mutually, the firs member 700 and the second member 800 thereof will not collide with each other, and the gap between the first member 700 and the second member 800 will not be large excessively, after the user finishes to operate the dual-axis hinge structure 200 to rotate both the first member 700 and the second member 800, namely, the first member 700 and the second member 800 are positioned abreast still.

Refer to FIG. 3A-FIG. 3C again, in this embodiment, a cross-section of the first pushed portion 321 (or the second pushed portion 322) is substantially presented as a circular so that each circular contacting surface of the first pushed portion 321 (or the second pushed portion 322) is longitudinal symmetry. Therefore, before and after the first summit 432 of the first convex potion 430 of the first wheel body 410 exactly contacts the circular contacting surface of the first pushed portion 321 (or the second pushed portion 322), the two rotating routes that the first cam 410 rotates are the same. Namely, a rotating route that the first cam 410 rotates until the first summit 432 exactly contacts the first pushed portion 321 (or the second pushed portion 322) is same as a rotating route that the first cam 410 rotates after the first summit 432 exactly contacts the first pushed portion 321 (or the second pushed portion 322).

Similarly, before and after the second summit 532 of the second convex potion 530 of the second wheel body 510 contacts the circular contacting surface, the two rotating routes that the second cam 510 rotates are the same. Namely, a rotating route that the second cam 510 rotates until the second summit 532 exactly contacts the first pushed portion 321 (or the second pushed portion 322) is same as a rotating route that the second cam 510 rotates after the second summit 532 exactly contacts the first pushed portion 321 (or the second pushed portion 322). Thus, it can make sure that the first member 700 and the second member 800 are symmetric and the positions of the first member 700 and the second member 800 after the first member 700 and the second member 800 are positioned abreast.

It is noticed that every pushed portion can be grouped in the scope of the present invention as long as the cross-section of the pushed portion is substantially presented with a symmetrical shape, thus, the two rotating routes that the cam rotates before and after the summit exactly contacts the contacting surface are the same. Thus, after the first member and the second member are positioned abreast, the symmetrically relative position of the first member and the second member can be guarantee.

Refer to FIG. 4A to FIG. 4D, FIG. 4A to FIG. 4D are cross sectional views of a pushed portion of the dual-axis hinge structure 200 in varied shapes according to different variations of the present invention.

Figure 4A:
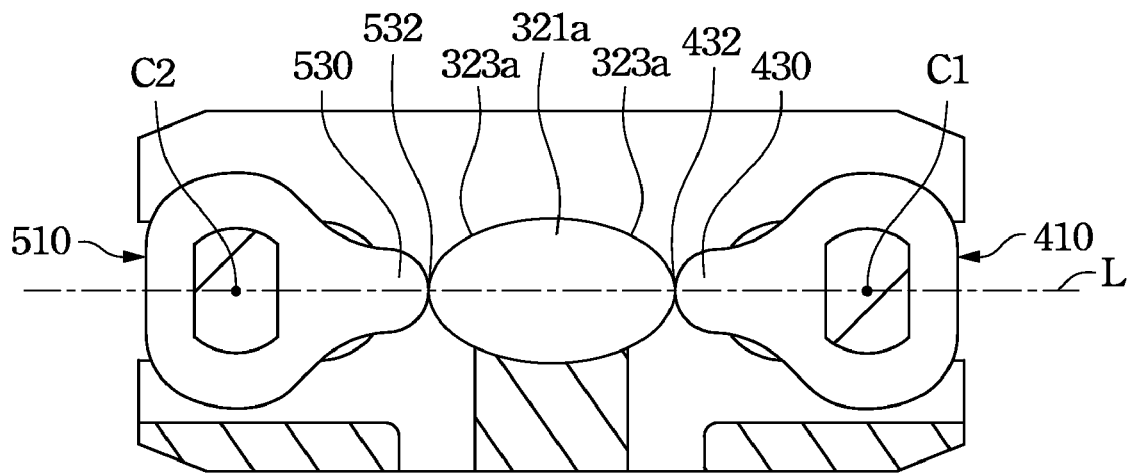
FIG. 4A to FIG. 4D are cross sectional views of a pushed portion of the dual-axis hinge structure in varied shapes according to different variations of the present invention.

In one of other embodiments, refer to FIG. 4A, a cross-section of the first pushed portion 321a is substantially presented as an elliptic shape in which the opposite contacting surfaces (i.e. left and right sides in FIG. 4A) of the ellipse are elliptical arc surfaces 323a, and a hypothetical center line L, which horizontally passes through the pivot point C1 and the pivot point C2, separates each elliptical arc surface 323a into an upper part and a lower part which are longitudinally symmetric.

Namely, when the first summit 432 is rotated to move on the hypothetical center line L, and exactly contacts the elliptical arc surface 323a of the first pushed portion 321a, two rotating routes that the first cam 410 rotates before and after the first summit 432 exactly contacts the elliptical arc surface 323a of the first pushed portion 321a are the same. When the second summit 532 is rotated to move on the hypothetical center line L, and exactly contacts the elliptical arc surface 323a of the first pushed portion 321a, two rotating routes that the second cam 510 rotates before and after the second summit 532 exactly contacts the elliptical arc surface 323a of the first pushed portion 321a are the same.

Thus, after the first member 700 and the second member 800 are positioned abreast, the symmetrically relative position of the first member 700 and the second member 800 can be guarantee.

Figure 4B:
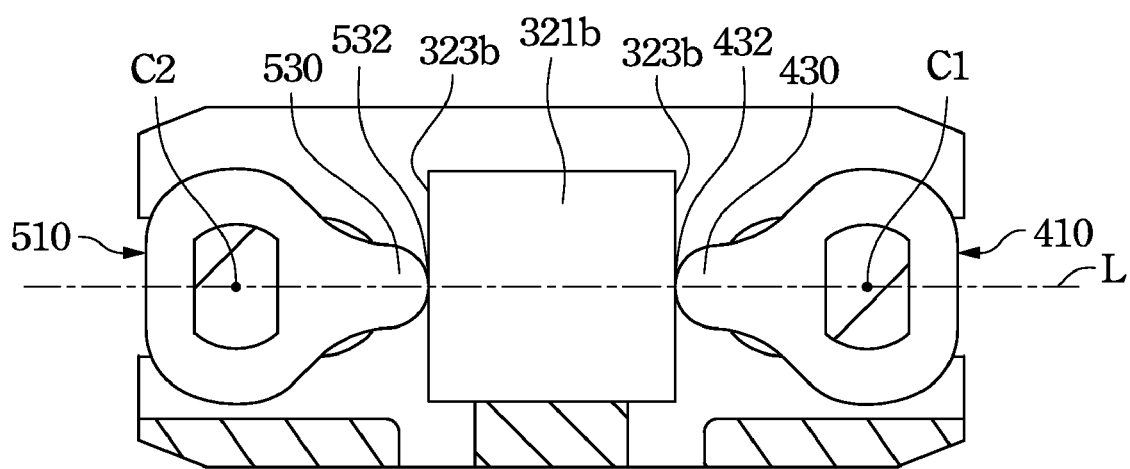

In another embodiment, refer to FIG. 4B, a cross-section of the first pushed portion 321b is substantially presented as a rectangular shape in which the opposite contacting surfaces (i.e. left and right sides in FIG. 4B) of the rectangle are flat surfaces 323b, and a hypothetical center line L, which horizontally passes through the pivot point C1 and the pivot point C2, separates each flat surface 323b into an upper part and a lower part which are longitudinally symmetric.

Namely, when the first summit 432 is rotated to move on the hypothetical center line L, and exactly contacts the flat surfaces 323b of the first pushed portion 321b, two rotating routes that the first cam 410 rotates before and after the first summit 432 exactly contacts the flat surfaces 323b of the first pushed portion 321b are the same. When the second summit 532 is rotated to move on the hypothetical center line L, and exactly contacts the flat surfaces 323b of the first pushed portion 321b, two rotating routes that the second cam 510 rotates before and after the second summit 532 exactly contacts the flat surfaces 323b of the first pushed portion 321b are the same.

Thus, after the first member 700 and the second member 800 are positioned abreast, the symmetrically relative position of the first member 700 and the second member 800 can be guarantee.

Figure 4C:
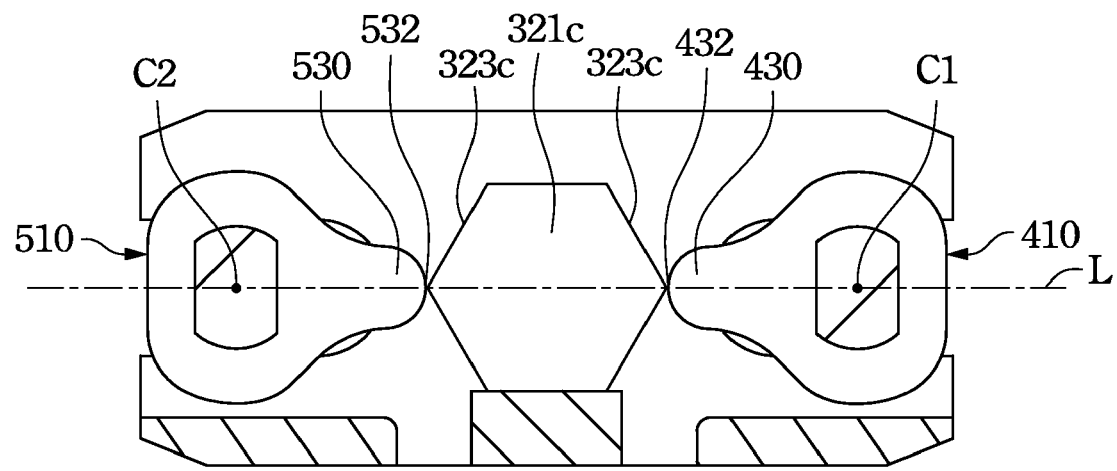

In another embodiment, refer to FIG. 4C, a cross-section of the first pushed portion 321c is substantially presented as a hexagonal shape in which the opposite contacting surfaces (i.e. left and right sides in FIG. 4C) of the hexagon are protruding peaks 323c constituted by two inclined flat surfaces connected with each other, and a hypothetical center line L, which horizontally passes through the pivot point C1 and the pivot point C2, separates each protruding peaks 323c into an upper part and a lower part which are longitudinally symmetric.

Namely, when the first summit 432 is rotated to move on the hypothetical center line L, and exactly contacts the protruding peaks 323c of the first pushed portion 321c, two rotating routes that the first cam 410 rotates before and after the first summit 432 exactly contacts the protruding peaks 323c of the first pushed portion 321c are the same. When the second summit 532 is rotated to move on the hypothetical center line L, and exactly contacts the protruding peaks 323c of the first pushed portion 321c, two rotating routes that the second cam 510 rotates before and after the second summit 532 exactly contacts the protruding peaks 323c of the first pushed portion 321c are the same.

Thus, after the first member 700 and the second member 800 are positioned abreast, the symmetrically relative position of the first member 700 and the second member 800 can be guarantee.

Figure 4D:
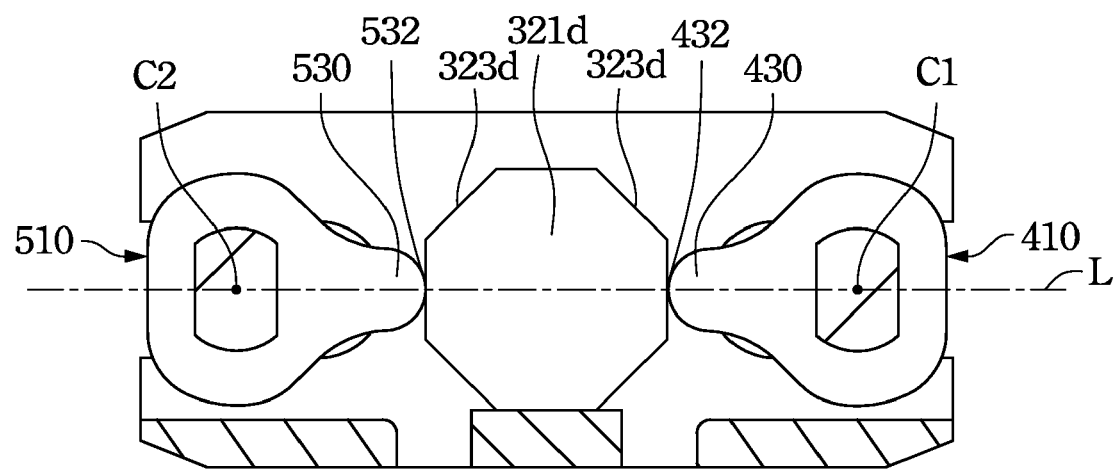

In further another embodiment, refer to FIG. 4D, a cross-section of the pushed portion 321d is substantially presented as an octagonal shape in which the opposite contacting surfaces (i.e. left and right sides in FIG. 4D) of the octagon are protruding portions 323d constituted by one level flat surface connected between two inclined flat surfaces, and a hypothetical center line L, which horizontally passes through the pivot point C1 and the pivot point C2, separates each protruding portion 323d into an upper part and a lower part which are longitudinally symmetric.

Namely, when the first summit 432 is rotated to move on the hypothetical center line L, and exactly contacts the protruding portion 323d of the first pushed portion 321d, two rotating routes that the first cam 410 rotates before and after the first summit 432 exactly contacts the protruding portions 321d of the first pushed portion 321d are the same. When the second summit 532 is rotated to move on the hypothetical center line L, and exactly contacts the protruding portions 323d of the first pushed portion 321d, two rotating routes that the second cam 510 rotates before and after the second summit 532 exactly contacts the protruding portions 323d of the first pushed portion 321d are the same.

Thus, after the first member 700 and the second member 800 are positioned abreast, the symmetrically relative position of the first member 700 and the second member 800 can be guarantee.

Figure 5:
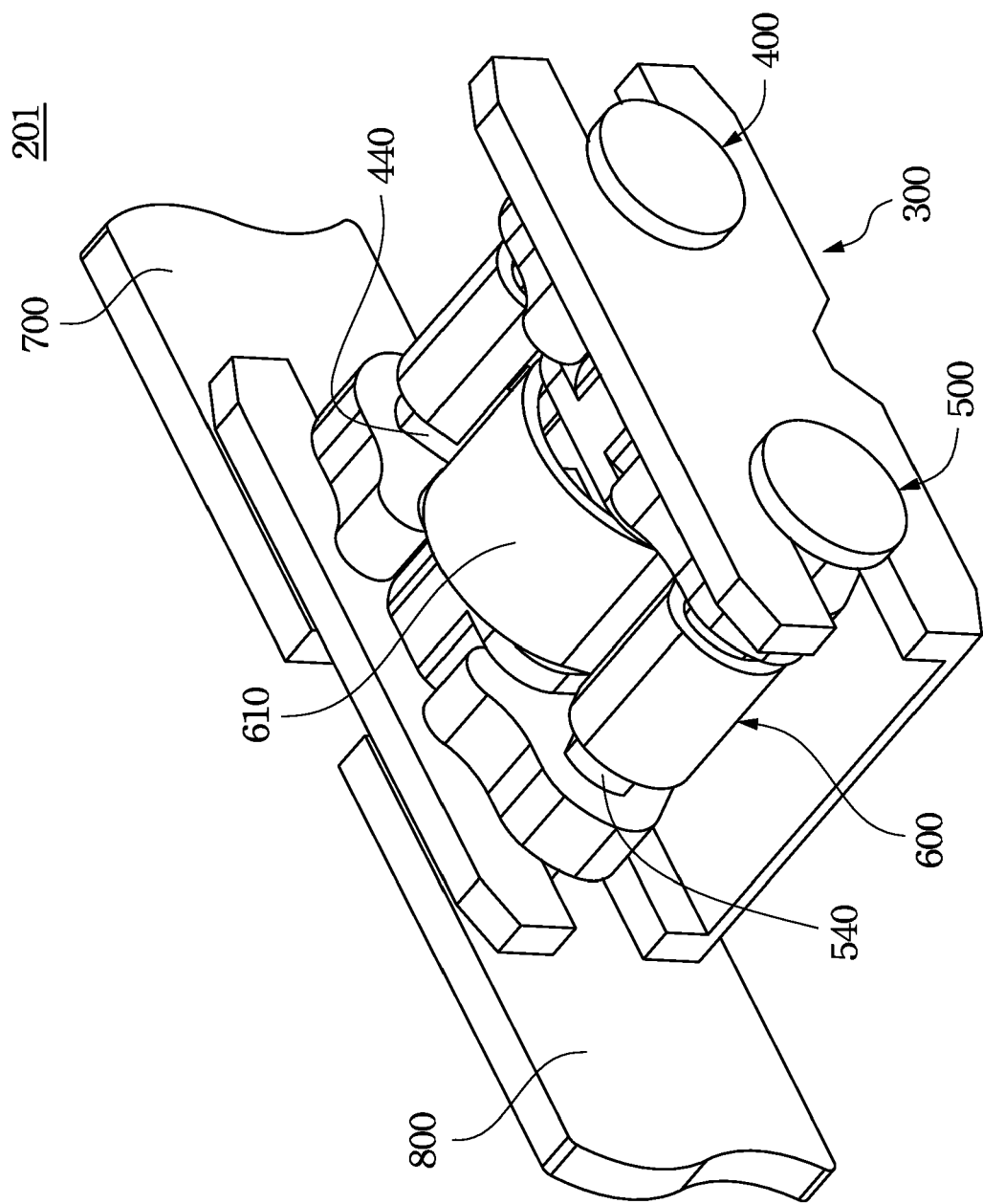
FIG. 5 is an assembling view of the dual-axis hinge structure according to another embodiment of the present invention.

Refer to FIG. 5, FIG. 5 is an assembling view of the dual-axis hinge structure 201 according to another embodiment of the present invention.

The elastic element 600 can be a plate spring 610, and is interposed between the first pivot portion 400 and the second pivot portion 500. Two opposite ends of the plate spring 610 respectively sleeve the first rotary shaft 440 and the second rotary shaft 540 so that the plate spring 610 is able to pull both the first rotary shaft 440 and the second rotary shaft 540 back to the original place.

Figure 6A:
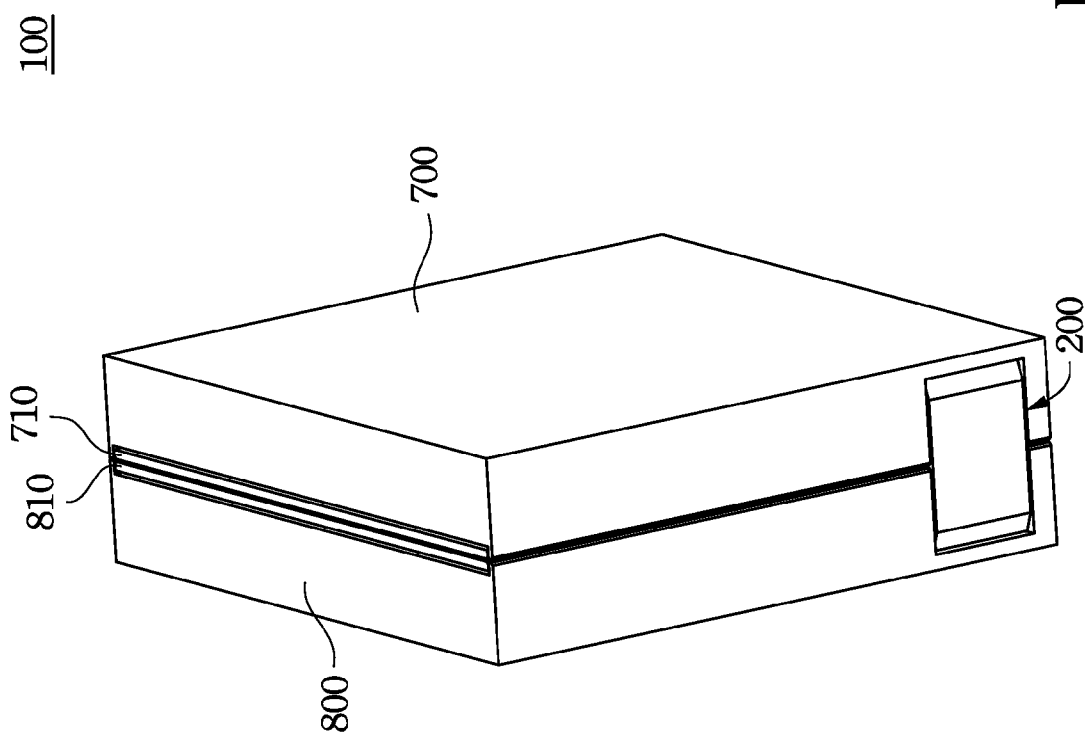
FIG. 6A is a perspective schematic view of an electric device having the dual-axis hinge structure in an folded mode according to the embodiment of the present invention.
Figure 6C:
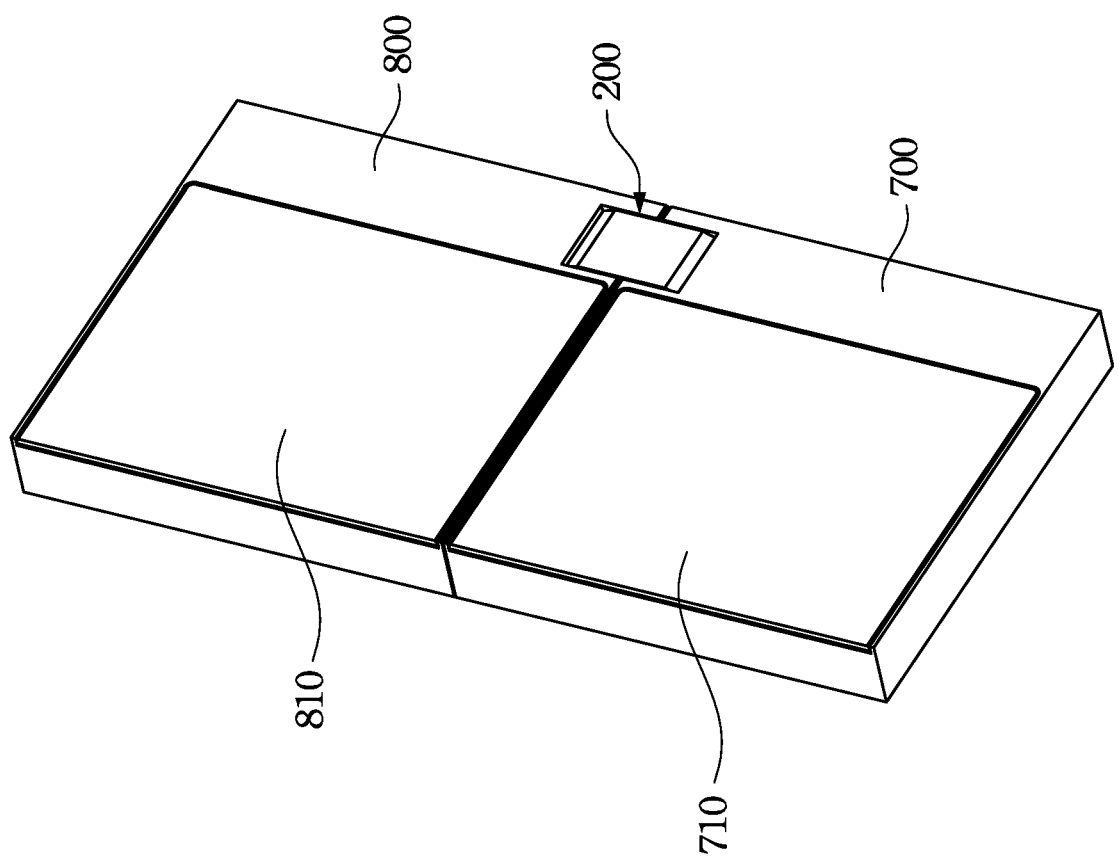
FIG. 6C is a perspective schematic view of an electric device having the dual-axis hinge structure in a unfolded mode according to the embodiment of the present invention.

Refer to FIG. 6A to FIG. 6C, FIG. 6A is a perspective schematic view of an electric device 100 having the dual-axis hinge structure 200 in an folded mode according to the embodiment of the present invention, FIG. 6B is a perspective schematic view of an electric device 100 having the dual-axis hinge structure 200 in a process between a folded mode and an unfolded mode according to the embodiment of the present invention, FIG. 6C is a perspective schematic view of an electric device 100 having the dual-axis hinge structure 200 in an unfolded mode according to the embodiment of the present invention.

The electric device 100 having the dual-axis hinge structure 200 adopted therein also is provided in this invention. The electric device 100 is not limited in type, for example, the electric device 100 is not only limited to a notebook computer, a mobile phone, a camera, a video game player or language translation device, etc., as long as the electric device 100 is a foldable typed electric device (e.g. foldable notebook computer, foldable mobile phone, foldable camera, foldable video game player or foldable language translation device).

For example, refer to FIG. 6A, when the electric device 100 is a foldable notebook computer, the foldable notebook computer comprises a first member 700, a second member 800, and the aforementioned dual-axis hinge structure 200.

The first member 700, for example, can be a lower machine body including a mainframe, an input element (e.g. keyboard, touch panel or screen), etc. The second member 800, for example, can be an upper machine body including a screen. The first member 700 and the second member 800 are adopted with the aforementioned dual-axis hinge structure 200.

When the first member 700 and the second member 800 are positioned abreast in an unfolded mode, a third gap X2 is formed between the first member 700 and the second member 800 (FIG. 3A and FIG. 6C).

When the dual-axis hinge structure 200 is operated to rotate both the first member 700 and the second member 800 such that the first summit 432 and the second summit 532 respectively exactly contact the opposite contacting surfaces of the first pushed portion 321 (or the second pushed portion, not shown), a fourth gap Y2 is formed between the first member 700 and the second member 800, and the fourth gap Y2 is greater than the third gap X2 (FIG. 3A, FIG. 3B and FIG. 6B).

Therefore, when the dual-axis hinge structure 200 is operated to rotate both the first member 700 and the second member 800, since the gap X1 between an axis point of the first rotary shaft 440 and an axis point of the second rotary shaft 540 can be dynamically enlarged (See FIG. 3A, FIG. 3B) to gap Y1, the gap X2 between the first member 700 and the second member 800 can be dynamically enlarged to gap Y2 as well. Thus, the first member 700 and the second member 800 can avoid from colliding with each other, and the first member 700 and the second member 800 do not need to be modified in product appearance.

Furthermore, the first member 700 is provided with a screen 710, and the second member 800 is provided with a screen 810. When the first member 700 and the second member 800 are positioned abreast in an unfolded mode (FIG. 6C), since the gap Y1 between an axis point of the first rotary shaft 440 and an axis point of the second rotary shaft 540 can be dynamically contracted (See FIG. 3B to FIG. 3A) to gap X1, the gap Y2 between the first member 700 and the second member 800 can be dynamically contracted to gap X2 as well.

Thus, the screens 710 of the first member 700 and the screens 810 of the second member 800 can be combined into a nearly seamless screen (FIG. 6C) so as to increase purchase intentions of consumers.

Although the present invention has been described with reference to the preferred embodiments thereof, it is apparent to those skilled in the art that a variety of modifications and changes may be made without departing from the scope of the present invention which is intended to be defined by the appended claims.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A dual-axis hinge structure, comprising:
   a hinge base comprising:
      at least one pushed portion having two opposite contacting surfaces thereof;
   a first pivot portion comprising:
      a first rotary shaft pivotally disposed on one end of the hinge base; and
      at least one first cam non-rotatably disposed on the first rotary shaft, and contacting to one of the opposite contacting surfaces of the pushed portion, wherein the first cam has a first summit thereon;
   a second pivot portion comprising:
      a second rotary shaft pivotally disposed on the other end of the hinge base, and being parallel to the first rotary shaft; and
      at least one second cam non-rotatably disposed on the second rotary shaft, and contacting to the other of the opposite contacting surfaces of the pushed portion, wherein the second cam has a second summit thereon;
   a restoring member interposed between the first rotary shaft and the second rotary shaft, and coupling to the first rotary shaft and the second rotary shaft,
   wherein when both the first cam and the second cam rotate such that the first summit and the second summit respectively contact the opposite contacting surfaces of the pushed portion, the first rotary shaft and the second rotary shaft are reversely moved away from the pushed portion.

2. The dual-axis hinge structure according to claim 1, wherein the first cam comprises:
   a first wheel body having a circumferential surface thereof, and non-rotatably penetrated through by the first rotary shaft; and
   a first convex portion protruding on the circumferential surface of the first wheel body, having two lateral surfaces, wherein the first summit is an intersection of the lateral surfaces of the first convex portion.

3. The dual-axis hinge structure according to claim 1, wherein the second cam comprises:
   a second wheel body having a circumferential surface thereof, and non-rotatably penetrated through by the second rotary shaft; and
   a second convex portion protruding on the circumferential surface of the second wheel body, having two lateral surfaces, wherein the second summit is an intersection of the lateral surfaces of the second convex portion.

4. The dual-axis hinge structure according to claim 1, wherein the hinge base further comprises:
   a bracket comprising a bottom plane and two opposite sidewalls extending unidirectionally outwards the bottom plane in parallel,
   wherein the bottom plane and the opposite sidewalls mutually surround a containing space, and the pushed portion is disposed in the containing space.

5. The dual-axis hinge structure according to claim 4, wherein each of the opposite sidewalls comprises:
   two elongate slits respectively disposed on two opposite ends of the sidewall.

6. The dual-axis hinge structure according to claim 1, wherein a cross-section of the pushed portion has a symmetrical shape.

7. The dual-axis hinge structure according to claim 6, wherein the symmetrical shape is in a circular, rectangular, hexagonal or octagonal shape.

8. The dual-axis hinge structure according to claim 6, wherein a rotating route that the first cam rotates before the first summit contacts the pushed portion is same as a rotating route that the first cam rotates after the first summit contacts the pushed portion, and a rotating route that the second cam rotates before the second summit contacts the pushed portion is same as a rotating route that the second cam rotates after the second summit contacts the pushed portion.

9. The dual-axis hinge structure according to claim 1, wherein the restoring member is a coil spring or a plate spring.

10. An electric device comprising:

a dual-axis hinge structure according to claim 1;

a first member fixedly disposed on the first rotary shaft; and a second member fixedly disposed on the second rotary shaft, wherein when the first member and the second member are positioned abreast, a first gap is formed between the first member and the second member, when the first summit and the second summit respectively contact the opposite contacting surfaces of the pushed portion, a second gap which is larger than the first gap, is formed between the first member and the second member.

11. The electric device according to claim 10, wherein the electric device is a foldable electric device.

* * * * *